United States Patent
Paul

(10) Patent No.: US 10,963,600 B2
(45) Date of Patent: Mar. 30, 2021

(54) ROCK STRENGTH AND IN-SITU STRESSES FROM DRILLING RESPONSE

(71) Applicant: CONOCOPHILLIPS COMPANY, Houston, TX (US)

(72) Inventor: Pijush K. Paul, Houston, TX (US)

(73) Assignee: ConocoPhillips Company, Houston, TX (US)

( * ) Notice: Subject to any disclaimer, the term of this patent is extended or adjusted under 35 U.S.C. 154(b) by 31 days.

(21) Appl. No.: 15/204,606

(22) Filed: Jul. 7, 2016

(65) Prior Publication Data

US 2017/0009575 A1 Jan. 12, 2017

Related U.S. Application Data

(60) Provisional application No. 62/190,413, filed on Jul. 9, 2015.

(51) Int. Cl.
| | |
|---|---|
| G06F 17/50 | (2006.01) |
| E21B 49/00 | (2006.01) |
| E21B 41/00 | (2006.01) |
| G01V 99/00 | (2009.01) |
| G06F 30/20 | (2020.01) |

(52) U.S. Cl.
CPC .............. *G06F 30/20* (2020.01); *E21B 41/00* (2013.01); *E21B 49/00* (2013.01); *E21B 49/003* (2013.01); *G01V 99/005* (2013.01)

(58) Field of Classification Search
CPC ....... E02D 1/022; E21B 49/00; E21B 49/006; E21B 49/003; G06F 17/5009; G01V 99/005

USPC .............. 73/152.01, 152.02, 152.03, 152.43, 73/152.44, 152.45, 152.46, 784, 78, 4

See application file for complete search history.

(56) References Cited

U.S. PATENT DOCUMENTS

| | | | | |
|---|---|---|---|---|
| 4,599,904 A | * | 7/1986 | Fontenot | G01N 33/24 |
| | | | | 73/152.46 |
| 4,852,399 A | * | 8/1989 | Falconer | E21B 44/00 |
| | | | | 175/39 |
| 4,914,591 A | * | 4/1990 | Warren | G01N 33/24 |
| | | | | 175/40 |
| 5,205,164 A | | 4/1993 | Steiger et al. | |

(Continued)

FOREIGN PATENT DOCUMENTS

| | | | | |
|---|---|---|---|---|
| WO | 2015051027 A1 | | 4/2015 | |
| WO | WO 2015051027 A1 | * | 4/2015 | ............. E21B 44/00 |

OTHER PUBLICATIONS

Song, Lisa "Measurement of Minimum Horizontal Stress from Loggin and drilling Data in Unconventional Oil and Gas" Thesis, Aug. 2012. <https://prism.ucalgary.ca/bitstream/handle/11023/158/Ucalgary_2012_Song_Lisa.pdf?sequence=2&isAllowed=y>.*

(Continued)

*Primary Examiner* — Jonathan M Dunlap

(57) ABSTRACT

Estimating in-situ stress of an interval having drilling response data is described. Estimating involves obtaining drilling response data of a data rich interval with available data. Estimating relative rock strength as a composite value that includes in-situ stress and rock strength. Estimating a Poisson's ratio from the relative rock strength. Generating a stress model that includes uniaxial strain model using the Poisson's ratio. Verifying the stress model with the available data. Applying the stress models in a non-data rich interval.

18 Claims, 2 Drawing Sheets

(56) References Cited

U.S. PATENT DOCUMENTS

| | | | | |
|---|---|---|---|---|
| 5,415,030 | A * | 5/1995 | Jogi | E21B 12/02 175/39 |
| 6,109,368 | A * | 8/2000 | Goldman | E21B 12/02 175/39 |
| 6,131,673 | A * | 10/2000 | Goldman | E21B 12/02 175/39 |
| 7,412,331 | B2 * | 8/2008 | Calhoun | E21B 45/00 702/9 |
| 7,991,554 | B2 * | 8/2011 | Calhoun | E21B 45/00 702/9 |
| 8,082,104 | B2 * | 12/2011 | de Reynal | E21B 49/003 702/11 |
| 8,619,500 | B2 * | 12/2013 | Gray | G01V 1/50 367/75 |
| 9,022,140 | B2 * | 5/2015 | Marx | E21B 44/00 175/24 |
| 9,926,776 | B2 | 3/2018 | Zha | |
| 10,120,343 | B2 | 11/2018 | Chiu | |
| 10,227,865 | B2 | 3/2019 | Chiu | |
| 10,345,771 | B2 | 7/2019 | Anno | |
| 2004/0176911 | A1 * | 9/2004 | Bratton | G01V 1/50 702/6 |
| 2006/0149478 | A1 * | 7/2006 | Calhoun | E21B 44/00 702/9 |
| 2006/0153005 | A1 * | 7/2006 | Herwanger | E21B 41/0064 367/38 |
| 2008/0249714 | A1 * | 10/2008 | Calhoun | E21B 44/00 702/9 |
| 2009/0109794 | A1 | 4/2009 | Sinha | |
| 2010/0155142 | A1 | 6/2010 | Thambynayagam et al. | |
| 2010/0191471 | A1 * | 7/2010 | de Reynal | E21B 49/003 702/9 |
| 2011/0182144 | A1 * | 7/2011 | Gray | G01V 1/30 367/75 |
| 2011/0246159 | A1 | 10/2011 | Herwanger et al. | |
| 2015/0041120 | A1 | 2/2015 | Gumarov et al. | |
| 2015/0090498 | A1 | 4/2015 | Hareland | |
| 2015/0168597 | A1 * | 6/2015 | Bai | G01V 99/00 703/10 |
| 2016/0333672 | A1 | 11/2016 | Klie | |
| 2016/0370260 | A1 | 12/2016 | Anno | |
| 2019/0211665 | A1 | 7/2019 | Zha | |
| 2019/0292895 | A1 | 9/2019 | Cobb | |
| 2019/0292899 | A1 | 9/2019 | Ramsay | |

OTHER PUBLICATIONS

Hankins et al. "An Integrated Approach for Drilling Optimization Using Advanced Drilling Optimizer". Journal of Petroleum Engineering, vol. 2015. (Year: 2015).*

Amani et al. "Prediction of Rock Strength using Drilling Data and Sonic Logs" International Journal of Computer Applications (0975-8887). vol. 81, No. 2. Nov. 2013. (Year: 2013).*

Kelessidis, V.C. "Rock drillability prediction from in situ determined unconfined compressive strength of rock" The Journal of the South African Institute of Mining and Metallurgy, vol. 11, Jun. 2011, pp. 429-436 (Year: 2011).*

Hareland et al. "Use of Drilling Parameters To Predict In-Situ Stress Bounds", 1993 SPE/IADC Drilling Conference, Feb. 23-25, 1993. <https://www.onepetro.org/conference-paper/SPE-25727-MS> (Year: 1993).*

Song et al., "Minimum Horizontal Stress Profile from Rock Strength for Montney Formation in North East British Columbia Canada", 47th US Rock Mechanics / Geomechanics Symposium, Jun. 23-26, 2013. <https://www.onepetro.org/conference-paper/ARMA-2013-141> (Year: 2013).*

International Search Report for related application, App. No. PCT/US2016/041341, dated Oct. 5, 2016.

Grandi, Samantha, et al., "Geomechanical Modeling of In-Situ Stresses Around a Borehole" In: Massachusetts Institute of Technology, ERL Industry Consortia Technical Reports; 2002.

EP Supplemental Search Report dated Jun. 13, 2018; 4 pgs.

* cited by examiner

ROCK STRENGTH AND IN-SITU STRESSES FROM DRILLING RESPONSE

PRIOR RELATED APPLICATIONS

This application is a non-provisional application which claims benefit under 35 USC § 119(e) to U.S. Provisional Application Ser. No. 62/190,413 filed Jul. 9, 2015, entitled "ROCK STRENGTH AND IN-SITU STRESSES FROM DRILLING RESPONSE," which is incorporated herein in its entirety.

FIELD OF THE INVENTION

This invention generally relates to reservoir engineering. More specifically, the present invention relates to estimation of in-situ stresses of Earth's crust using drilling response.

BACKGROUND OF THE INVENTION

In-situ stress of the earth's crust is regarded as one of the most important parameters used in engineering design of oil and gas operations. For example, wellbore failure can occur when the stress concentrated around a borehole exceeds strength of the rock. Certain operational activities (e.g., depletion or injection) can alter initial in-situ stress state of a reservoir. These stress changes can cause slip on pre-existing faults, which can be helpful to enhance effective permeability and higher fluid production from the reservoir. However, enhanced permeability along a large fault may cause uncontrolled fluid escape outside the reservoir. Thus, efficient recovery of hydrocarbons can hinge on an accurate understanding of mechanisms of stress in the earth's crust and their dynamics with reference to oil field operation.

Conventional estimation of in-situ stress typically involves analyzing openhole logs and image data, which are collected at data rich interval at reservoir depth. These approaches often use analytical solutions for in-situ stress estimation based on elastic assumptions. These solutions generally require two parameters (i.e., Young's modulus and Poisson's ratio) to define elastic properties of the rock. The parameters can be determined by sonic and density logs or lab measurements. However, these stress estimation approaches cannot be used or struggle in cases where sonic and image data is lacking. Data scarcity can be very common in overburden section of a well, in development wells due to production constraints, and in unconventional wells due to budgetary constraints.

BRIEF SUMMARY OF THE DISCLOSURE

This invention generally relates to reservoir engineering. More specifically, the present invention relates to estimation of in-situ stresses of Earth's crust using drilling response.

One example of a method for estimating in-situ stress of an interval having drilling response data includes: obtaining drilling response data of a data rich interval with available data; estimating relative rock strength as a composite value that includes in-situ stress and rock strength; estimating a Poisson's ratio from the relative rock strength; generating a stress model that includes uniaxial strain model using the Poisson's ratio; verifying the stress model with the available data; and applying the stress models in a non-data rich interval.

Another example of a method for estimating in-situ stress of an interval having drilling response data includes: obtaining drilling response data of a data rich interval with available data; b) estimating relative rock strength as a composite value that includes in-situ stress and rock strength; c) estimating a Poisson's ratio from the relative rock strength; generating a stress model that includes horizontal maximum and minimum stress models that use the Poisson's ratio; verifying the stress model with the available data; and applying the stress models in a non-data rich interval.

BRIEF DESCRIPTION OF THE DRAWINGS

A more complete understanding of the present invention and benefits thereof may be acquired by referring to the follow description taken in conjunction with the accompanying drawings in which.

DETAILED DESCRIPTION

Figure 1:
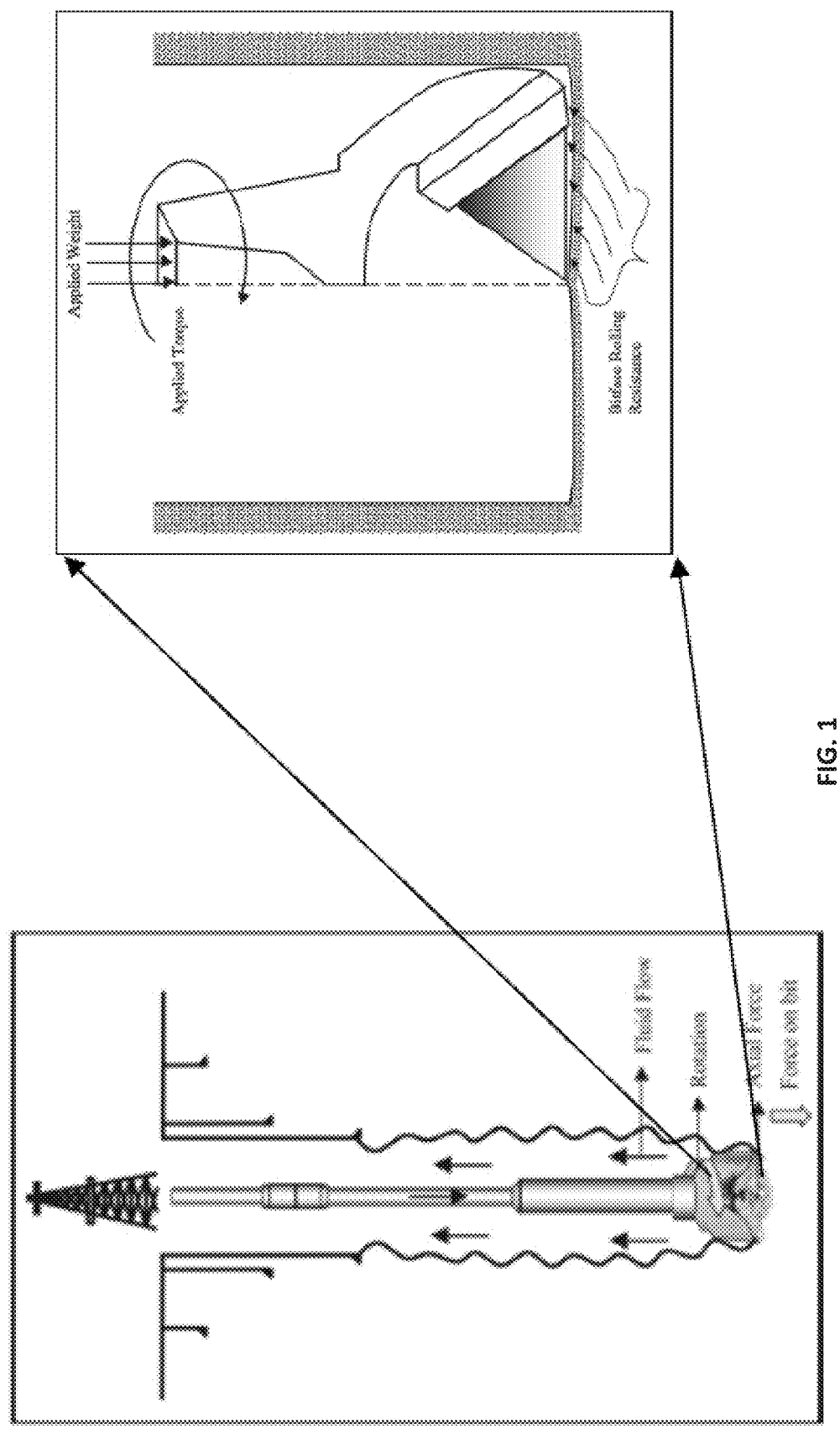
FIG. 1 illustrates basic elements of drilling

Turning now to the detailed description of the preferred arrangement or arrangements of the present invention, it should be understood that the inventive features and concepts may be manifested in other arrangements and that the scope of the invention is not limited to the embodiments described or illustrated. The scope of the invention is intended only to be limited by the scope of the claims that follow.

The following examples of certain embodiments of the invention are given. Each example is provided by way of explanation of the invention, one of many embodiments of the invention, and the following examples should not be read to limit, or define, the scope of the invention.

In-situ stress is typically estimated using analytical tools based on frictional equilibrium concept or elastic plane-strain concept. These tools require image and sonic logs and core lab tests to estimate the stresses. Usually, these data are only available at reservoir depth as sonic and image log response are not recorded in an overburden interval.

The present invention provides tools and methods for estimating principal in-situ stresses of the earth's crust using drilling response data, which is readily available in most if not all drilled wells. Analytical and empirical tools can be utilized to estimate stresses using obtained drilling response such as weight on bit (WOB), rate of penetration (RoP), and rotations per minute (RPM), mud type and the like. Data rich reservoir intervals are used to calibrate and validate drilling response related stress model, which in turn can be used at intervals and wells that lack sonic and image data. Using this approach, stresses can be estimated in overburden intervals, and development and unconventional wells where sonic and wellbore image logs may not be collected due to field limitations or budgetary constraints. Thus, one of the advantages of the present invention is that in-situ stress can be estimated independently along a wellbore in intervals where drilling responses may be the only available data. Other advantages will be apparent from the disclosure herein.

An accurate estimation of in-situ stresses is highly useful in many important applications. For example, the present invention may be used to address containment issues where reservoir and injected fluid leaked through faults, natural fracture or hydraulic fractures. This leakage can occur because of a lack of constraint on the in-situ stress, which prevents estimating a threshold injection pressure in the reservoir or disposal intervals. In one embodiment, the present invention can provide estimation of in-situ stress throughout the wells to obtain an uncertainty range in injection pressure.

In some development wells, data are not collected because it is assumed that the data collected from exploration wells are sufficient to estimate stress at reservoir depth. This is not always true. Even years of production and injection change the in-situ stress and data from a nearby well does not ensure a correct estimate of in-situ stress. In one embodiment, the present invention obtains current in-situ stress by calibrating stress model at data rich exploration wells and using the model in a current drilling response of development wells to estimate the current in-situ stress.

In unconventional wells, wireline or logging data may not be acquired due to budgetary constraints. However, in-situ stress is very important in designing a hydraulic stimulation operation, which is required to enhance permeability for economic production of hydrocarbons. Lack of accurate stress information can lead to wrong selection of the producing intervals which results in lack-luster production performance from the well. This invention with more realistic consideration of in-situ stress estimation provide better results, and will help in planning and executing hydraulic stimulation operation. This will also help in drilling future wells through overburden which require in-situ stress estimates to drill and complete the well successfully.

In-Situ Stress Estimation

The present invention utilizes fundamental concepts of drilling engineering to link the drilling response with in-situ stress. FIG. 1 illustrates the basic elements of drilling. As drill bits respond to in-situ response and rock strength intersected during drilling, drilling responses such as WOB and RoP have the information linked to in-situ stress and rock strength:

$$S = \sqrt{\left(\frac{1}{R} - \frac{2c}{ND}\right)\left(\frac{N^b W^2}{aD^3}\right)} \quad (1)$$

where S is equivalent rock strength, R is rate of penetration, N is rotary speed, D is bit diameter, W is weight on bit, b is a dimensionless exponent for the rotary speed effect on RoP, and a and c are dimensionless bit constants.

However, drilling bits observe effects of in-situ stress and rock strength as one equivalent parameter. In accordance with the present invention, the equivalent parameter is estimated by the development of Relative Rock Strength (RRS) as shown in equation (2):

$$RRS = f(\text{effective stress, rock strength}) \quad (2)$$

Figure 2:
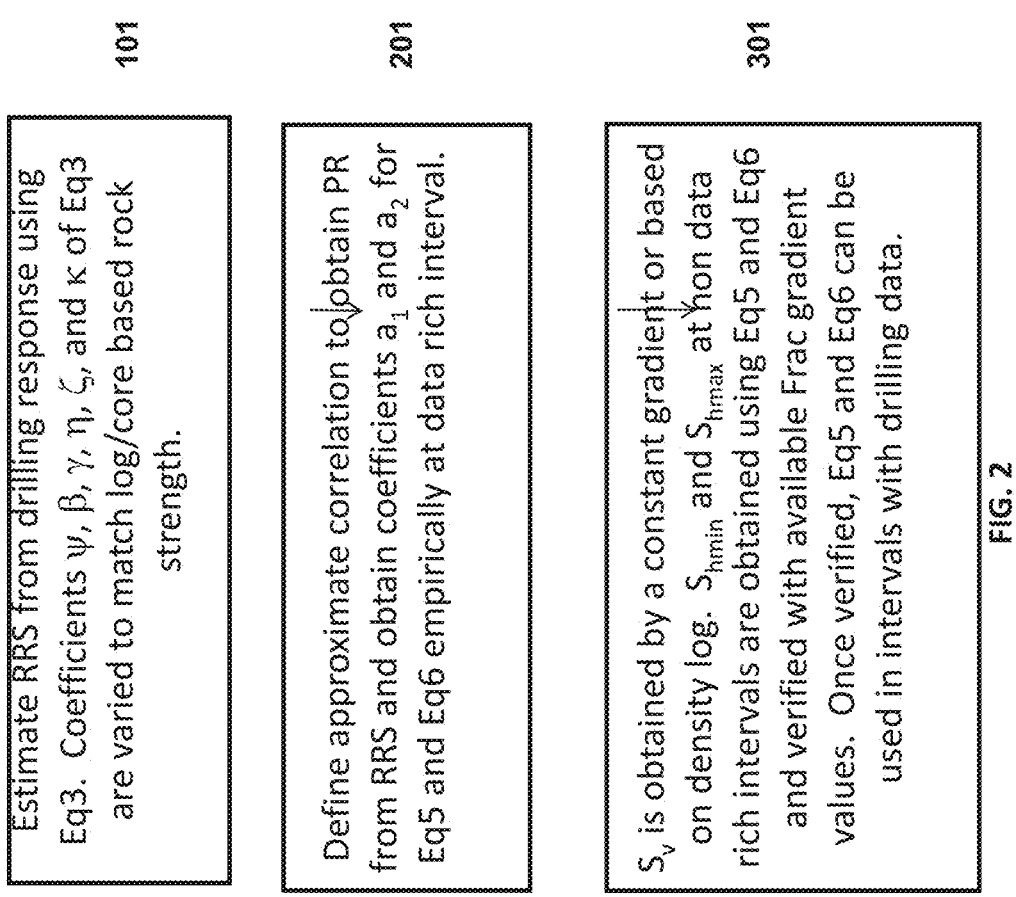
FIG. 2 illustrates steps involved in estimating in-situ stress.

This step is summarized as 101 in FIG. 2. Equations (1) and (3) represent independent approaches of estimating rock strength. The parameters of equations (1) and/or (3) can be varied until stress matches log/core based results.

Next, RRS is correlated to rock strength estimations from log data and lab test results in the data rich intervals at reservoir depth as shown in equation (3):

$$RRS = f(R, N, W) = \psi\{\beta W + \gamma(N-\eta) + \zeta(R-\kappa)\} \quad (3)$$

where $\psi$, $\beta$, $\gamma$, $\eta$, $\zeta$, and $\kappa$ are coefficients relating RRS to unconfined compressive strength $C_0$ at data rich intervals. Assuming elastic homogeneity, horizontal stress from a uniaxial model is given as $$S_{hmin} - \alpha P_p = (S_v - \alpha P_p)\left(\frac{v}{1-v}\right) \quad (4)$$

where $S_v$ is overburden stress, $P_p$ is reservoir fluid pressure or pore pressure, $\alpha$ is Biot coefficient, and v is Poisson's ratio.

A modified version of uniaxial strain model using the RRS is generated at this data rich interval as shown in equations (5) and (6).

$$S_{hmin} - \alpha P_p = (S_v - \alpha P_p)\left(\frac{v}{1-v}\right) + a_1 C_0 \Rightarrow S_{hmin} - \alpha P_p \quad (5)$$

$$= (S_v - \alpha P_p)\left\{\frac{f(RRS)}{1 - f(RRS)}\right\} + a_1 RRS$$

$$S_{Hmax} - \alpha P_p = (S_v - \alpha P_p)\left(\frac{v}{1-v}\right) + a_2 C_0 \Rightarrow S_{Hmax} - \alpha P_p \quad (6)$$

$$= (S_v - \alpha P_p)\left\{\frac{f(RRS)}{1 - f(RRS)}\right\} + a_2 RRS$$

where $S_{hmin}$ and $S_{Hmax}$ are minimum and maximum horizontal stress respectively. Poisson's ratio can be defined as a function of RRS at data rich intervals. For practical purposes $C_0$ is equal to RRS or S. Coefficients $a_1$ and $a_2$ are obtained empirically at data rich interval. This step is summarized as 201 in FIG. 2.

This modified version of stress model is established by the empirical correlation between the stress response from uniaxial strain model using Poisson's ratio generated by RRS and stress results from the frictional equilibrium concept. Frictional equilibrium concept is considered as best technique to estimate the in-situ stress. The final modified version of stress model requires RRS as an input and RRS requires WOB, RoP and RPM as an input, which comes directly from the drilling response.

In step 301 of FIG. 2, the overburden stress is obtained by a constant gradient or based on density log. The minimum and maximum horizontal stress are obtained using equations (5) and (6) and verified with Frac gradient values. Once verified, equations (5) and (6) can be used in intervals with drilling data.

Once the stress model is established at a data rich interval, stress magnitudes are estimated and verified against the minimum principal stress estimated from hydraulic fracture test (extended leak-off test, formation integrity test, diagnostic fracture initiation test, etc.) at some interval not used to establish the stress model. Once this is verified, it is ready to be used in the intervals and wells with drilling response only.

In closing, it should be noted that the discussion of any reference is not an admission that it is prior art to the present invention, especially any reference that may have a publication date after the priority date of this application. At the same time, each and every claim below is hereby incorporated into this detailed description or specification as additional embodiments of the present invention.

Although the systems and processes described herein have been described in detail, it should be understood that various changes, substitutions, and alterations can be made without departing from the spirit and scope of the invention as defined by the following claims. Those skilled in the art may be able to study the preferred embodiments and identify other ways to practice the invention that are not exactly as described herein. It is the intent of the inventors that variations and equivalents of the invention are within the scope of the claims, while the description, abstract and drawings are not to be used to limit the scope of the invention. The invention is specifically intended to be as broad as the claims below and their equivalents.

The invention claimed is:

1. A method comprising:
   obtaining drilling response data of a data rich interval with available data, the drilling response data comprising:
   weight on bit (WOB),
   rate of penetration (RoP), and
   rotations per minute (RPM);
   obtaining a composite value that includes in-situ stress and rock strength from the data rich interval with the available data, wherein the composite value is or approximates relative rock strength (RRS);
   generating a stress model that includes a uniaxial strain model using a Poisson's ratio in the data rich interval with the available data and the drilling response data;
   verifying the stress model with the available data in the data rich interval with the available data;
   applying the stress model in a non-data rich interval; and
   obtaining estimated stress magnitudes in the non-data rich interval.

2. The method according to claim 1, wherein the relative rock strength is defined as $\psi\{\beta W+\gamma(N-\eta)+\zeta(R-\kappa)\}$ wherein $\psi$, $\beta$, $\gamma$, $\eta$, $\zeta$, and $\kappa$ are coefficients correlating the rock strength to unconfined compressive strength, wherein W is the WOB, N is rotary speed, and R is the RoP.

3. The method according to claim 2, wherein $\psi$, $\beta$, $\gamma$, $\eta$, $\zeta$, and $\kappa$ are varied to match log or core data based rock strength.

4. The method according to claim 1, wherein the non-data rich interval is an overburden interval.

5. The method according to claim 1, wherein the available data includes log data or image data or both.

6. The method according to claim 1, wherein the stress model is verified with Frac gradient values.

7. The method according to claim 1, wherein the stress model is established by an empirical correlation between stress response from the uniaxial strain model and stress results from a frictional equilibrium model.

8. The method according to claim 1, wherein the relative rock strength is defined as $$\sqrt{\left(\frac{1}{R}-\frac{2c}{ND}\right)\left(\frac{N^b W^2}{aD^3}\right)}$$

wherein R is the RoP, N is rotary speed, D is bit diameter, W is the WOB, b is a dimensionless exponent for an effect of the rotary speed on R, and a and c are dimensionless bit constraints.

9. The method according to claim 8, wherein R, N, D, W, b, a, and c are varied to match log or core data based rock strength.

10. A method comprising:
    obtaining drilling response data of a data rich interval with available data the drilling response data comprising:
    weight on bit (WOB),
    rate of penetration (RoP), and
    rotations per minute (RPM);
    estimating a composite value of in-situ stress and rock strength, wherein the composite value is or approximates relative rock strength (RSS) in the data rich interval;
    generating a stress model that includes horizontal maximum and minimum stress models that use a Poisson's ratio;
    verifying the stress model with the available data in the data rich interval;
    applying the stress model in a non-data rich interval; and
    obtaining estimated stress magnitudes in the non-data rich interval.

11. The method according to claim 10, wherein the relative rock strength is defined as $\psi\{\beta W+\gamma(N-\eta)+\zeta(R-\kappa)\}$ wherein $\psi$, $\beta$, $\gamma$, $\eta$, $\zeta$, and $\kappa$ are coefficients correlating rock strength to unconfined compressive strength, wherein W is the WOB, N is rotary speed, and R is the RoP.

12. The method according to claim 11, wherein $\psi$, $\beta$, $\gamma$, $\eta$, $\zeta$, and $\kappa$ are varied to match log or core data based rock strength.

13. The method according to claim 10, wherein the non-data rich interval is an overburden interval.

14. The method according to claim 10, wherein the available data includes log data or image data or both.

15. The method according to claim 10, wherein the stress model is verified with Frac gradient values.

16. The method according to claim 10, wherein the stress model is established by an empirical correlation between stress response from the strain model and stress results from a frictional equilibrium model.

17. The method according to claim 10, wherein the relative rock strength is defined as $$\sqrt{\left(\frac{1}{R}-\frac{2c}{ND}\right)\left(\frac{N^b W^2}{aD^3}\right)}$$

wherein R is the RoP, N is rotary speed, D is bit diameter, W is the WOB, b is a dimensionless exponent for an effect of the rotary speed on R, and a and c are dimensionless bit constraints.

18. The method according to claim 17, wherein R, N, D, W, b, a, and c are varied to match log or core data based rock strength.

* * * * *